United States Patent
Peters

(10) Patent No.: US 7,239,137 B2
(45) Date of Patent: Jul. 3, 2007

(54) METHOD AND APPARATUS FOR FAST SPIN ECHO (FSE) PRESCAN PHASE CORRECTION

(75) Inventor: Robert D. Peters, Sussex, WI (US)

(73) Assignee: General Electric Company, Schenectady, NY (US)

( * ) Notice: Subject to any disclaimer, the term of this patent is extended or adjusted under 35 U.S.C. 154(b) by 4 days.

(21) Appl. No.: 11/162,704

(22) Filed: Sep. 20, 2005

(65) Prior Publication Data

US 2007/0063704 A1 Mar. 22, 2007

(51) Int. Cl.
*G01V 3/00* (2006.01)
(52) U.S. Cl. .................................... 324/307
(58) Field of Classification Search ............... 324/309, 324/307
See application file for complete search history.

(56) References Cited

U.S. PATENT DOCUMENTS

| 5,378,985 | A | * | 1/1995 | Hinks | 324/309 |
| 5,818,229 | A | | 10/1998 | Kanazawa | |
| 6,275,036 | B1 | * | 8/2001 | van Yperen et al. | 324/307 |
| 6,369,568 | B1 | * | 4/2002 | Ma et al. | 324/309 |
| 2004/0135578 | A1 | * | 7/2004 | Peters et al. | 324/309 |
| 2005/0270025 | A1 | * | 12/2005 | Nozaki et al. | 324/307 |

OTHER PUBLICATIONS

Ahn et al., A New Phase Correction Method in NMR Imaging Based on Autocorrelation and Histogram Analysis, IEEE Trans. Med. Imaging, 1987, pp. 32-36, vol. MI-6, No. 1.
Hennig et al., Rare Imaging: A Fast Imaging Method for Clinical MR, Magnetic Resonance in Medicine, 1986, pp. 823-833, vol. 3, Publisher: Academic Press, Inc.

* cited by examiner

*Primary Examiner*—Brij Shrivastav
*Assistant Examiner*—Megann E Vaughn
(74) *Attorney, Agent, or Firm*—Ziolkowski Patent Solutions Group, SC

(57) ABSTRACT

A method and apparatus for prescan phase correction analyzes the phase profile of the first echo sampled in a prescan and the phase profile corresponding to the lope echo of an impending FSE acquisition to determine appropriate phase correction settings of the FSE scan.

19 Claims, 3 Drawing Sheets

METHOD AND APPARATUS FOR FAST SPIN ECHO (FSE) PRESCAN PHASE CORRECTION

BACKGROUND OF THE INVENTION

The present invention relates generally to magnetic resonance (MR) imaging and, more particularly, to determining prescan phase corrections for a fast spin echo (FSE) acquisition.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Fast spin echo imaging is one of the most widely used MR imaging techniques for clinical applications. Fast spin echo imaging is often preferred because it is tailored to acquire T2, proton density, or T1-weighted images in a relatively short period of time. In this regard, FSE imaging is commonly used for neuro, body, and extremity studies.

Fast spin echo acquisitions are based on the so-called RARE (rapid acquisition with relaxation enhancement) technique. With a FSE pulse sequence, multiple echoes within an echo train are phase encoded. That is, FSE imaging techniques use multiple phase encode steps in conjunction with multiple 180-degree refocusing pulses per repetition time (TR) interval to produce a train of echoes. Typical FSE acquisitions sample an echo train from four to thirty-two echoes and, as such, can achieve a scan reduction factor of four to thirty-two compared to conventional spin echo sequences. With FSE imaging, each echo of the echo train experiences differing amounts of phase encoding that correspond to different lines in k-space. While advantageously reducing scan time and thereby increasing subject throughput, FSE images are prone to excessive ghosting, particularly in shoulder, spine, and head images.

A number of techniques has been developed to reduce ghosting in FSE images. Currently, the primary technique involves the use of a FSE prescan (FSEPS) phase correction. The conventional FSEPS technique acquires non-phase encoded echo data in a prescan of the subject. The phase profiles of the first two echoes in the prescan echo train are then compared to one another to determine a phase correction coefficient or value. This phase correction coefficient is then used to modify the relative phase of the 180 degree refocusing pulses as well as the area of the readout prephaser gradient of the impending FSE scan to improve phase coherence among all the echoes of the echo train of the FSE acquisition. While effective in reducing ghosting in FSE images, this conventional FSEPS phase correction technique is limited in the degree by which ghosting can be reduced. Specifically, since the first two echoes are automatically selected, current FSEPS phase correction fails to account for ghosting levels being highly dependent upon the lope echo of the echo train. The lope echo corresponds to that echo of the echo train that receives zero phase encoding during the FSE acquisition.

It would therefore be desirable to have a system and method capable of FSE phase correction that considers the relationship between the lope echo of an echo train and ghosting levels.

BRIEF DESCRIPTION OF THE INVENTION

The present invention is directed to a method and apparatus for FSE prescan phase correction that overcomes the aforementioned drawbacks. In this regard, the present invention includes a prescan phase correction technique for FSE acquisitions whereby the phase profile of the first echo sampled in a prescan and the phase profile corresponding to the echo at or near the lope echo of an impending FSE acquisition are analyzed to determine appropriate phase shifts to refocusing pulses and adjustments to the area of the readout prephaser gradient pulse of the FSE scan.

Therefore, in accordance with one aspect of an invention, an MR imaging apparatus has a plurality of gradient coils positioned about a bore of a magnet to impress a polarizing magnetic field and an RF transceiver system and an RF switch controlled by a pulse module to transmit RF signals to an RF coil assembly to acquire MR images. The MR imaging apparatus further includes a computer programmed to define a FSE pulse sequence to acquire MR data from a subject and apply the FSE pulse sequence without phase encoding to acquire echo data from a non-phase encoded echo train. The computer is further programmed to analyze a phase profile of an $M^{th}$ echo of the non-phase encoded echo train with a phase profile of an $(M+N)^{th}$ echo of the non-phase encoded echo train, wherein N is greater than one. The computer is also programmed to determine phases of RF refocusing pulses and area of the readout prephaser gradient of the FSE pulse sequence from the analysis, and apply the FSE pulse sequence with phase encoding to acquire echo data from a phase encoded echo train with phase coherence.

In accordance with another aspect, the present invention includes a method of FSE imaging that includes the step of executing a scout scan to acquire non-phase encoded echo data from a reference echo train. The method further includes the steps of determining an echo of the reference train that corresponds to a lope echo of an impending FSE acquisition and comparing a phase of the first echo of the reference echo train to that echo of the reference echo train corresponding to the lope echo. The method then calibrates the impending FSE acquisition to reduce phase incoherence between echos of the impending FSE acquisition from the comparison. The method continues with the acquisition of the MR data with the calibrated FSE acquisition.

According to another aspect, the invention is embodied in a computer program stored on a computer readable storage medium having instructions that when executed by a computer cause the computer to acquire non-phase encoded MR data from an echo train and compare a phase profile of the first echo of the echo train with a phase profile of another echo of the echo train. The another echo corresponds to an echo with an echo number greater than two. The computer is then caused to determine a phase coherence correction value from the comparison and prospectively modify RF refocusing pulses and area of a readout prephaser gradient of an impending scan based on the phase coherence correction value to reduce phase incoherence between echoes of an echo train sampled in the impending scan.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
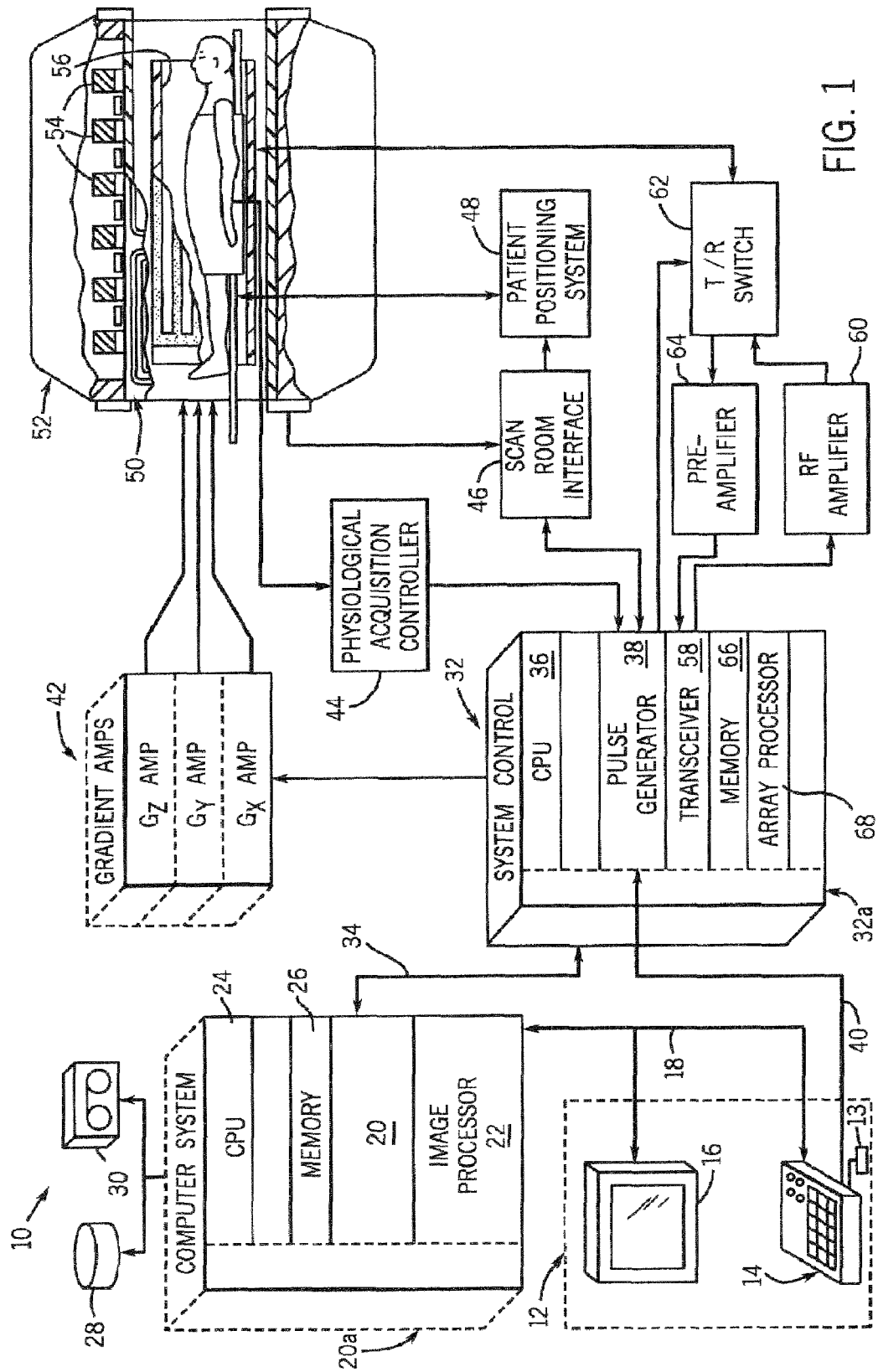
FIG. 1 is a schematic block diagram of an MR imaging system for use with the present invention.

Referring to FIG. 1, the major components of a preferred MR imaging apparatus 10 incorporating the present invention are shown. The operation of the apparatus is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a method of prescan FSE phase correction that can be carried out on the MR apparatus of FIG. 1 or equivalents thereof. As will be described, the invention is effective in reducing ghosting levels in FSE images by improving phase coherence along an FSE echo train. In this regard, the present invention improves FSE image quality and, as such, is an effective diagnostic tool for clinical applications that reduces the number of repeat scans that are required of a subject and increases subject throughput.

Figure 2:
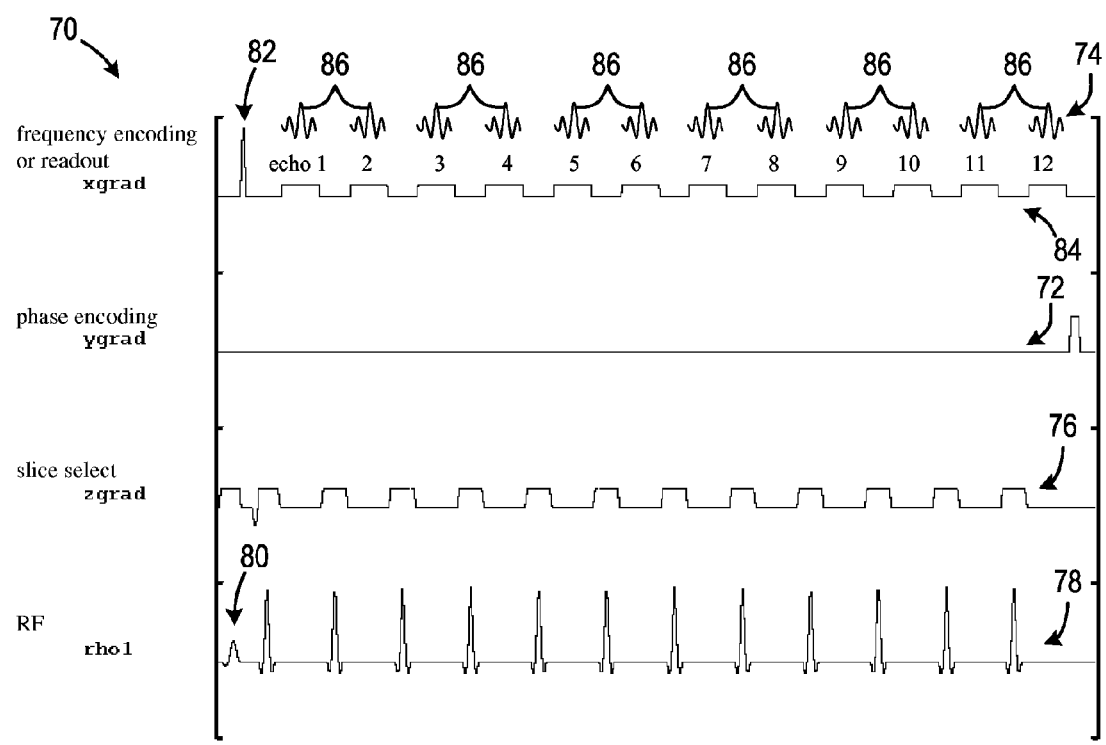
FIG. 2 is a pulse sequence diagram of an FSE prescan phase correction in accordance with the present invention.

Referring now to FIG. 2, a pulse sequence diagram of an FSE prescan phase correction according to the present invention is shown. The pulse sequence 70 is played out in a prescan to determine phase corrections for refocusing pulses of an impending FSE scan. In this regard, the prescan pulse sequence 70 acquires non-phase encoded data. As such, no phase encoding gradient 72 is applied during the acquisition of echo train 74. Slice select gradient pulses 76 are played out as well as a series of RF refocusing pulses 78. The refocusing pulses 78 each have a flip angle of 180 degrees and are played out following a 90 degree excitation pulse 80. In the illustrated example, pulse sequence 70 includes a readout prephaser gradient 82 that is applied in the frequency or readout direction. Following the prephaser gradient, a series of frequency encoding or readout gradients 84 are played out to frequency encode the echoes 86 of echo train 74. In the exemplary pulse sequence, twelve readout gradients are played out to sample an echo train length (ETL) of twelve echoes.

In known prescan phase correction techniques, echo 1 and echo 2 of the echo train 74 are analyzed. In this regard, zeroth-order corrections are applied through relative phase shifts to the 180 degree refocusing pulses and first-order corrections are applied through adjustments to the readout prephaser gradient based on a comparison of the phase profiles of echo 1 and echo 2. As described above, however, determining phase correction based on the first two echoes of the echo train is of limited success. Therefore, in accordance with the present invention, the phase profiles of the first echo and that echo corresponding to at or near the lope echo of the FSE echo train are analyzed to determine phase coherence correction. In a preferred embodiment, either the lope echo, (lope echo$-1^{th}$), or (lope echo$+1^{th}$) echo is used as the "second" echo that is analyzed with the first echo of the echo train. The phase profiles of the first echo and this "second" echo are then analyzed in accordance with conventional prescan phase correction techniques to determine appropriate phase shifts to the RF refocusing pulses to improve phase coherence during the acquisition of imaging data with the FSE pulse sequence. One skilled in the art will appreciate that the pulse sequence illustrated in FIG. 2 is applied with the phase-shifted refocusing pulses and with the phase encoding gradient enabled during an FSE imaging scan such that phase encoded data is acquired for image reconstruction.

As described above, it is preferred that the "second" echo that is analyzed with the first echo of the echo train be determined from the lope echo of the echo train. Moreover, it is preferred that the "second" echo be an even echo. Thus, it is preferred that the lope echo be an even echo. As described above, the lope echo corresponds to that echo of the echo train that receives zero phase encoding during the phase encoded FSE acquisition. In this regard, the lope echo is related to the effective echo time (TE). The effective TE is determined when the central views in k-space are acquired, which are usually the first echoes of the echo train with subsequent echoes usually spaced apart with the same echo spacing time and with the latest echoes sampled being the further away from the center of k-space. As TE is usually a user input when setting the parameters of the FSE acquisition, the lope echo is determined from the user input of TE. It is also contemplated that the user may input the echo number of the lope echo directly whereupon effective TE is determined therefrom. Additionally, it is contemplated that the lope echo may be an odd echo. If that is the case, the even echo nearest to the lope echo should be used as the "second" echo for phase correction analysis.

Figure 3:
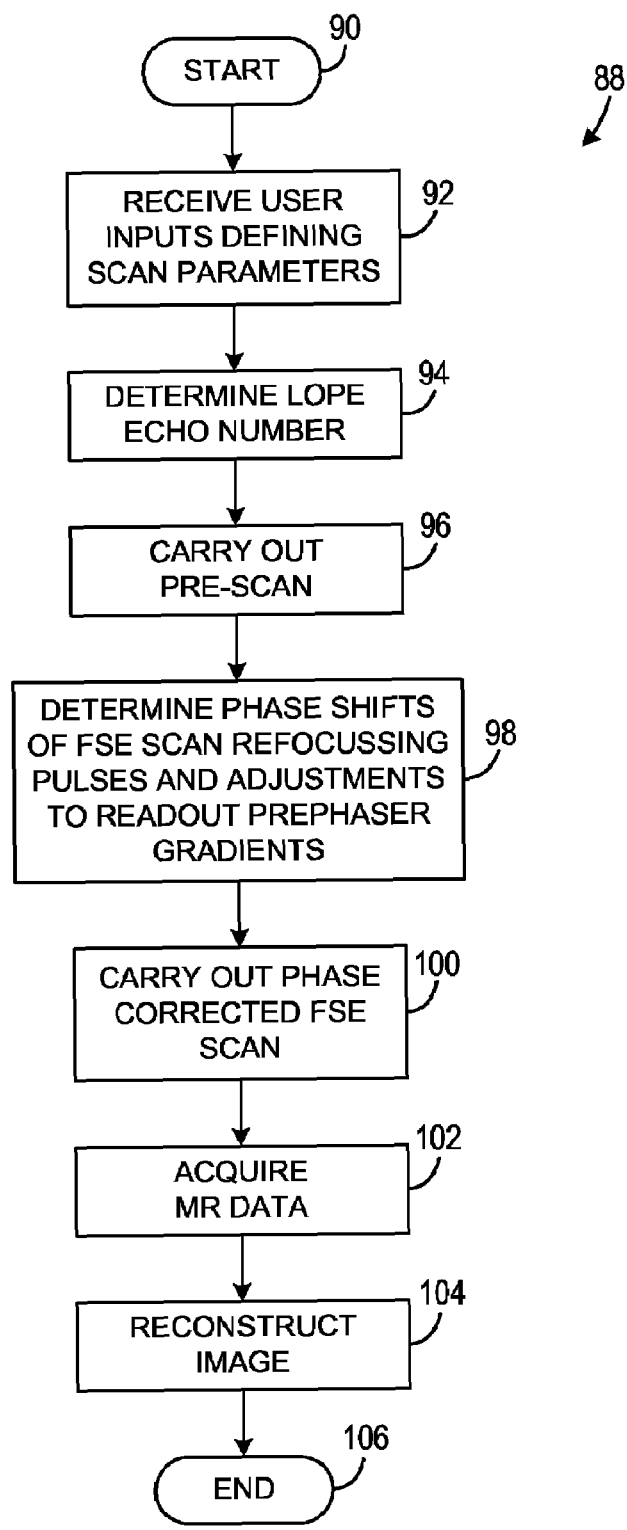
FIG. 3 is a flow chart setting forth the steps of a phase correction technique according to the present invention.

Accordingly, in referring to FIG. 3, the steps of a prescan phase correction technique according to the present invention are set forth. The prescan phase correction technique 88 begins at 90 with user prescription of an impending FSE scan. In this regard, user inputs defining scan parameters of the impending FSE scan are received at 92. Based on the user inputs, the echo number corresponding to the lope echo of an echo train to be sampled in the impending FSE scan is determined. Preferably, the lope echo is an even numbered echo in the echo train. If not, the even echo nearest the lope echo is identified and, as described, is used for phase correction. The technique 88 continues with execution of a prescan at 96 to acquire non-phase encoded MR data. The phase profile of the first echo of the sampled echo train and that echo corresponding to the lope echo (or nearest the lope echo) are analyzed to determine appropriate phase shifts for the refocusing pulses of the impending FSE scan to reduce phase incoherence in the sampled echo train of the impending FSE scan. As such, once the appropriate phase shifts have been determined and applied, technique 88 proceeds with carrying out a phase corrected FSE scan 100. In this regard, MR data is acquired at 102 and an image reconstructed at 104 in accordance with known data acquisition and reconstruction techniques. The prescan phase correction technique then ends at 106.

Therefore, an MR imaging apparatus is disclosed as having a plurality of gradient coils positioned about a bore of a magnet to impress a polarizing magnetic field and an RF transceiver system and an RF switch controlled by a pulse module to transmit RF signals to an RF coil assembly to acquire MR images. The MR imaging apparatus further includes a computer program to define an FSE pulse sequence to acquire MR data from a subject and apply the FSE pulse sequence without phase encoding to acquire echo data from a non-phase encoded echo train. The computer is further programmed to analyze a phase profile of an $M^{th}$ echo of the non-phase encoded echo train with a phase profile of a $(M+N)^{th}$ echo of the non-phase encoded echo train, wherein N is greater than one. The computer is also programmed to determine phases of RF refocusing pulses of the FSE pulse sequence from the analysis and apply the FSE pulse sequence with phase encoding to acquire data from the phase encoded echo train with phase coherence.

The present invention is also embodied in a method of FSE imaging that includes the step of executing a scan to acquire non-phase encoded echo data from a reference echo train. The method further includes the steps of determining an echo for the reference train that corresponds to a lope echo of an impending FSE acquisition and comparing a phase of the first echo the reference echo train to that echo of the reference echo train corresponding to the lope echo. The method then calibrates the impending FSE acquisition to reduce phase incoherence between echoes of the impending FSE acquisition from the comparison. The method continues with the acquisition of MR data with the calibrated FSE acquisition.

The invention is also embodied in a computer program stored on a computer-readable storage medium having instructions that when executed by a computer cause the computer to acquire non-phase encoded MR data from an echo train and compare a phase profile of the first echo of the echo train with a phase profile of another echo of the echo train. The other echo corresponds to an echo with an echo number greater than two. The computer is then caused to determine a phase coherence correction value from the comparison and prospectively modify RF refocusing pulses of an impending scan based on the phase coherence correction value to reduce phase incoherence between echoes of an echo train sampled in the impending scan.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) imaging apparatus comprising:
   a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
  define a fast spin echo (FSE) pulse sequence to acquire MR data from a subject;
  apply the FSE pulse sequence without phase encoding to acquire echo data from a non-phase encoded echo train;
  analyze a phase profile of a $M^{th}$ echo of the non-phase encoded echo train with a phase profile of an $(M+N)^{th}$ echo of the non-phase encoded echo train, wherein N>1;
  determine phases of RF refocusing pulses and adjustments to an area of a readout prephaser gradient of the FSE pulse sequence from the analysis; and
  apply the FSE pulse sequence with phase encoding to acquire echo data from a phase encoded echo train.

2. The MR imaging apparatus of claim 1 wherein the computer is further programmed to determine the $(M+N)^{th}$ echo from a user-selected echo time (TE).

3. The MR imaging apparatus of claim 1 wherein the computer is further programmed to select the $(M+N)^{th}$ echo as that echo at or nearest a lope echo of the non-phase encoded echo train.

4. The MR imaging apparatus of claim 1 wherein the $M^{th}$ echo is an odd echo and the $(M+N)^{th}$ echo is an even echo.

5. The MR imaging apparatus of claim 1 wherein the $M^{th}$ echo is an even echo and the $(M+N)^{th}$ echo is an odd echo.

6. The MR imaging apparatus of claim 1 wherein the $M^{th}$ echo is the first echo of the non-phase encoded echo train.

7. The MR imaging apparatus of claim 1 wherein the computer is further programmed to apply the FSE pulse sequence without phase encoding in a single scout scan.

8. The MR imaging apparatus of claim 1 wherein the computer is further programmed to select the $(M+N)^{th}$ echo as that echo number of the phase encoded echo train that would correspond to zero phase encoding.

9. The MR imaging apparatus of claim 1 wherein the computer is further programmed to reconstruct an image from the echo data of the phase encoded echo train that is substantially free of phase incoherence induced ghosting.

10. A method of FSE imaging, the method comprising the steps of:
  executing a scout scan to acquire non-phase encoded echo data from a reference echo train;
  determining an echo of the reference echo train that corresponds to a lope echo of an impending FSE acquisition;
  comparing a phase of the first echo of the reference echo train to that echo of the reference echo train corresponding to the lope echo;
  calibrating the impending FSE acquisition to reduce phase incoherence between echoes of the impeding FSE acquisition from the comparison; and acquiring MR data with the calibrated FSE acquisition.

11. The method of claim 10 wherein the step of calibrating includes applying phase shifts to refocusing pulses of the impending FSE acquisition and applying a first-order correction to a readout prephaser pulse of the impending FSE acquisition.

12. A computer readable storage medium having stored thereon a computer program comprising instructions which when executed by a computer cause the computer to:
  acquire non-phase encoded MR data from an echo train;
  compare a phase profile of the first echo of the echo train with a phase profile of another echo of the echo train, the another echo having an echo number greater than two;
  determine a phase coherence correction value from the comparison; and
  prospectively modify RF refocusing pulses and area of a readout prephaser gradient of an impending scan based on the phase coherence correction value to reduce phase incoherence between the RF refocusing pulses.

13. The computer readable storage medium of claim 12 wherein the impending scan includes an FSE acquisition with phase encoding.

14. The computer readable storage medium of claim 12 wherein the another echo corresponds to a lope echo of an echo train to be sampled in the impending scan.

15. The computer readable storage medium of claim 14 wherein the another echo is an odd echo.

16. The computer readable storage medium of claim 14 wherein the another echo is an even echo.

17. The computer readable storage medium of claim 12 wherein the instructions further cause the computer to determine the another echo from a user-input identifying a desired TE of the impending scan.

18. The computer readable storage medium of claim 12 wherein the computer is further caused to apply phase shifts to refocusing pulses of the impending scan and apply a first-order correction to a readout prephaser pulse of the impending scan.

19. The computer readable storage medium of claim 12 wherein the computer is further caused to execute a scout scan to acquire the non-phase encoded MR data.

* * * * *